United States Patent
Triyoso et al.

(10) Patent No.: US 7,303,983 B2
(45) Date of Patent: Dec. 4, 2007

(54) ALD GATE ELECTRODE

(75) Inventors: Dina H. Triyoso, Austin, TX (US); Olubunmi O. Adetutu, Austin, TX (US); James K. Schaeffer, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/331,763

(22) Filed: Jan. 13, 2006

(65) Prior Publication Data

US 2007/0166970 A1    Jul. 19, 2007

(51) Int. Cl.
*H01L 21/3205* (2006.01)

(52) U.S. Cl. ................. 438/592; 257/E21.021

(58) Field of Classification Search ........ 438/584–585, 438/591, 142, 592
See application file for complete search history.

(56) References Cited

U.S. PATENT DOCUMENTS

| | | | | |
|---|---|---|---|---|
| 6,013,546 A | * | 1/2000 | Gardner et al. | 438/231 |
| 6,287,965 B1 | * | 9/2001 | Kang et al. | 438/648 |
| 6,703,708 B2 | * | 3/2004 | Werkhoven et al. | 257/751 |
| 2002/0000598 A1 | * | 1/2002 | Kang et al. | 257/301 |
| 2004/0023478 A1 | * | 2/2004 | Samavedam et al. | 438/592 |
| 2004/0043600 A1 | * | 3/2004 | Vaartstra | 438/627 |
| 2004/0192021 A1 | * | 9/2004 | Li | 438/622 |
| 2005/0095763 A1 | | 5/2005 | Samavedam et al. | 438/197 |
| 2005/0106877 A1 | * | 5/2005 | Elers et al. | 438/689 |

* cited by examiner

*Primary Examiner*—Scott B. Geyer
*Assistant Examiner*—Reema Patel
(74) *Attorney, Agent, or Firm*—Hamilton & Terrile, LLP; Michael Rocco Cannatti

(57) ABSTRACT

A semiconductor process and apparatus fabricate a metal gate electrode by forming a first conductive layer (22) over a gate dielectric layer (11), forming a transition layer (32) over the first conductive layer using an atomic layer deposition process in which an amorphizing material is increasingly added as the transition layer is formed, forming a capping conductive layer (44) over the transition layer, and then selectively etching the capping conductive layer, transition layer, and first conductive layer, resulting in the formation of an etched gate stack (52). By forming the transition layer (32) with an atomic layer deposition process in which the amorphizing material (such as silicon, carbon, or nitrogen) is increasingly added, the transition layer (32) is constructed having a lower region (e.g., 31, 33) with a polycrystalline structure and an upper region (e.g., 37, 39) with an amorphous structure that blocks silicon diffusion.

20 Claims, 5 Drawing Sheets

ALD GATE ELECTRODE

BACKGROUND OF THE INVENTION

1. Field of the Invention

The present invention is directed in general to the field of semiconductor devices. In one aspect, the present invention relates to the fabrication of metal gate electrodes used in semiconductor devices.

2. Description of the Related Art

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology is increasingly replacing silicon dioxide gate dielectrics and polysilicon gate conductors with high dielectric constant (high-k) dielectrics in combination with metal gate electrodes formed from a gate stack of polysilicon and one or more metal layers. With such technologies, the metal gate layers not only obviate gate-depletion and boron-penetration effects, but also provide a significantly lower sheet resistance.

While high-k dielectrics in conjunction with metal gate electrodes advantageously exhibit improved transistor performance, the use of new metal layer technologies can create new technical challenges. For example, conventional NMOS and PMOS metal gate technologies use metal materials that are not thermally stable with polysilicon. One of the primary issues arises when a poly/metal gate electrode is formed by capping a metal layer with a polycrystalline silicon, an example of which is illustrated in FIG. 1, which depicts a partial cross-sectional view of a semiconductor structure 1 including a substrate 2, a dielectric layer 6 and a conventionally etched gate electrode 3 constructed from a polysilicon layer 8 formed over a metal layer 4 (e.g., TaC). With such poly/metal gate structures, there can be a low-level diffusion of silicon from the polycrystalline 8, through the metal layer 4 and into the gate dielectric 6 after high temperature anneals (such as occur during a source/drain activation anneal). This diffusion appears to be the result of silicon diffusing through the metal grain boundaries and results in the formation of nodules 5, 7, 9. As the metal layer 4 is made thinner, the amount of silicon reaching the gate dielectric 6 increases, which increases the leakage current of the device. Though a thinner metal layer increases the interaction between the polysilicon and the $HfO_2$ results in devices with high leakage current, it can be desirable to have a thinner metal layer to minimize the exposure to chemically and physically aggressive gate etch processes that can pit the underlying dielectric and damage the substrate. In addition, prior metal gate fabrication processes relied on overly complex processes that did not address the thermal stability or leakage current problems.

Accordingly, a need exists for an improved poly/metal gate electrode and manufacture method for minimizing the interaction between the polysilicon and the high-k dielectric and subsequently reducing leakage current. There is also a need for a controlled fabrication process that reliably produces thermally stable metal gate electrodes. In addition, there is a need for improved semiconductor device structure and manufacturing process to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
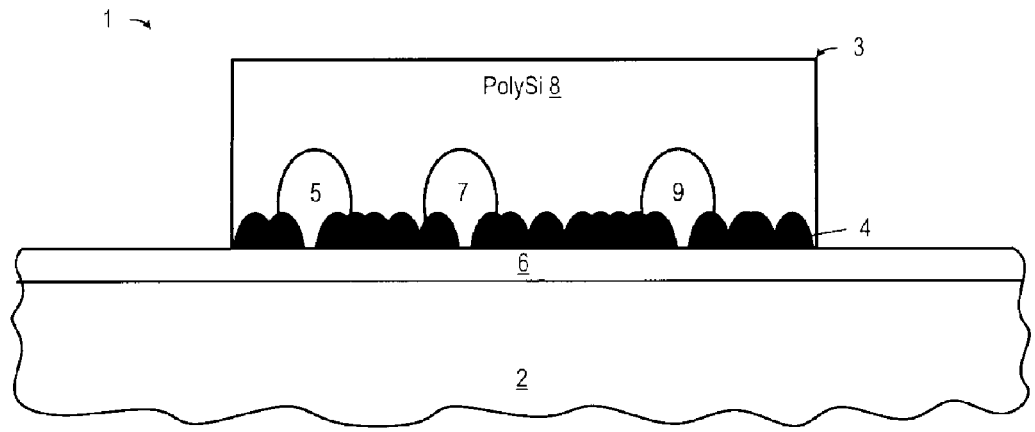
FIG. 1 is a partial cross-sectional view of a semiconductor structure including a conventionally formed metal/polysilicon gate electrode.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A graded metal gate electrode and its method of manufacture are described for fabricating a thermally stable gate stack using atomic layer deposition techniques. In a selected implementation, a barrier layer that transitions from a polycrystalline metal structure (e.g., TaC or MoN) to an amorphous structure is formed by adding an amorphizing element (such as nitrogen or silicon) in an increasing dosage during atomic layer deposition steps to form a graded barrier layer (e.g., TaC-TaSiC for NMOS or MoN-MoSiN for PMOS). The amorphous nature of the barrier material results in a continuous film that blocks direct interaction between the silane ($SiH_4$) gas used to deposit the subsequent polysilicon layer and the high-k gate dielectric. There are deleterious interactions when high-k gate oxides are exposed directly to silane gas that increase the leakage current of the dielectric material. Additionally, when a polysilicon cap layer is formed on the barrier layer, silicon from the polysilicon cap layer is prevented from diffusing by the uppermost amorphous region of the barrier layer. In addition, the polycrystalline structure, without the amorphizing element, of the lowermost region of the barrier layer is suitable for establishing the desired effective work function required for optimized transistor performance. With the approach(es) described herein, a thermally stable metal gate electrode structure is provided which has reduced gate leakage current and the desired effective work functions.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art.

Figure 2:
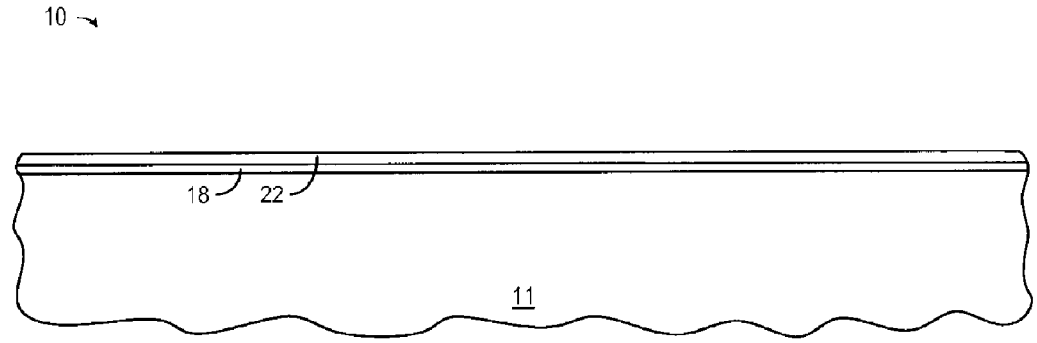
FIG. 2 is a partial cross-sectional view of a semiconductor structure including a substrate, a gate dielectric layer and a first work function-setting metal layer.

Turning now to FIG. 2, a partial cross-sectional view is depicted of a semiconductor structure 10, including a substrate 11, a gate dielectric layer 18 and a first work function-setting metal layer 22. Depending on the type of device being fabricated, the substrate 11 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 11 may be implemented as the top silicon layer of a silicon-on-insulator (SOI) structure. Though not illustrated, one or more isolation regions and/or well regions may be formed in the substrate 11 to define one or more active regions over which the transistor devices are formed, such as by using a twin well process in which first well is selectively implanted into portions of substrate 11 where devices of a first conductivity type will be formed while a second well is selectively implanted into regions of substrate 11 into which transistors of a second different and opposite conductivity type will be formed. Prior to forming the metal layer 22, an insulator or dielectric layer 18 is formed by depositing or growing an insulator or high-k dielectric (e.g., silicon dioxide, oxynitride, metal-oxide, nitride, etc.) over the semiconductor substrate 11 using chemical vapor deposition (CVD), plasma-enhanced chemical vapor deposition (PECVD), physical vapor deposition (PVD), atomic layer deposition (ALD), thermal oxidation, or any combination(s) of the above. In an illustrative implementation, first dielectric layer 18 is a metal-oxide compound formed by chemical vapor deposition, physical vapor deposition, or by atomic layer deposition having a typical final thickness is in the range of 0.1-10 nanometers, though other thicknesses may be used. A suitable metal oxide compound for use as first dielectric layer 18 is hafnium oxide (preferably $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $ZrHfOx$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties.

After forming the first dielectric layer 18, a first work function-setting metal or metal-based layer 22 is formed using any desired deposition or sputtering process, such as CVD, PECVD, PVD, ALD, molecular beam deposition (MBD) or any combination(s) thereof. The first metal-based layer 22 includes an element selected from the group consisting of Ta, Ir, Mo, Ru, W, Os, Nb, Ti, V, Ni, and Re. For example, the metal-based gate layer 22 may be formed over the first dielectric layer 18 using an atomic layer deposition (ALD) process that forms a TaC layer having a thickness of less than 20 Angstroms, though other metallic gate layer materials (such as MoN) or even a conductive metal oxide (such as $IrO_2$) with different thicknesses may be used. An example ALD process for depositing a thin TaC layer 22 selectively forms a layer of TaC on the surface of the semiconductor structure 10 by applying a $TaF_5$ pulse (or some other tantalum-containing precursor, such as tantalum halide or tantalum metal organic), then purging with Argon, then pulsing with plasma (e.g., $C_XH_Y$) and then purging with Argon again. This sequence of steps may be repeated until the desired thickness of TaC is obtained on the semiconductor structure 10. An example of ALD process for depositing a thin MoN layer 22 selectively forms a layer of MoN on the surface of the semiconductor structure 10 by alternately pulsing $MoCl_5$ and $NH_3$ and purging after every pulse using Ar, N2 or other inert gases.

As will be appreciated, the foregoing sequence of steps may be used to form a metal layer 22 that is used for both NMOS and PMOS transistor devices. In addition, if the PMOS and NMOS devices use different metal gate electrode materials, a similar ALD process may be used to form the different initial metal layer(s). In embodiments where the first metal layer 22 will ultimately remain as part of the final transistor structure, the material used to form the first metal layer 22 may be selected to have a work function that is close to the valence band of the silicon substrate, though the work function may also be set at or near to the conduction band of silicon if more than one type of metal is used to form the first metal layer 22.

Figure 3:
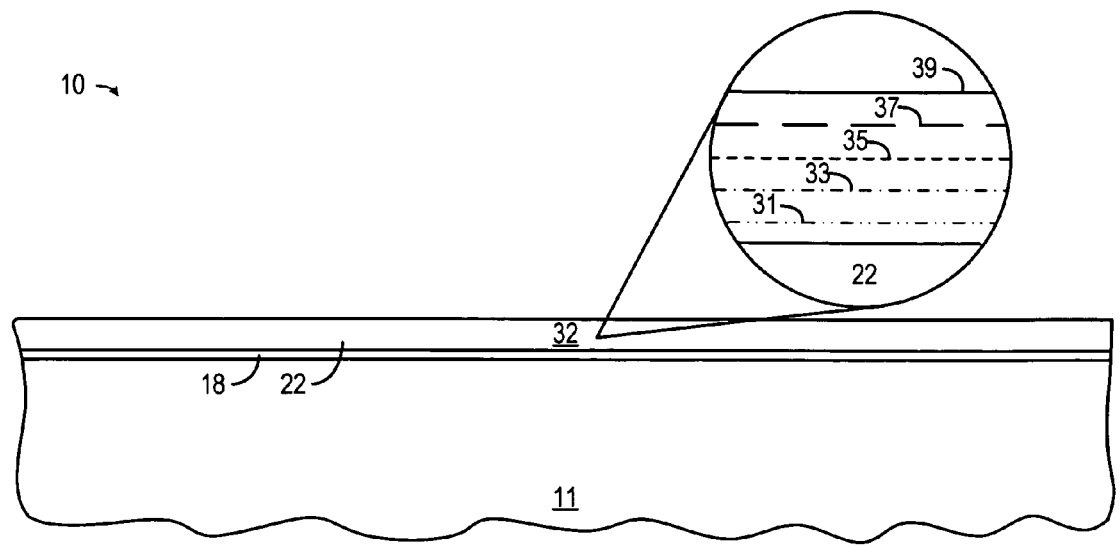
FIG. 3 illustrates processing subsequent to FIG. 2 after a barrier layer is formed on the first work function-setting metal layer by sequentially depositing increasingly amorphous transition layers.

After depositing the first metal layer 22, a barrier layer 32 is formed on the first work function-setting metal layer 22 by sequentially depositing increasingly amorphous transition layers, as illustrated in FIG. 3. In a selected embodiment, the barrier layer 32 is formed over the first metal TaC layer 22 as an amorphously graded layer using an atomic layer deposition (ALD) process wherein an amorphizing agent, such as N or Si or C, is gradually and increasingly added to form a graded TaCN or TaSiC layer 32. The amorphizing agent may differ depending on the composition of the first poly-crystalline work-function setting material. Both N and Si can be used to convert a TaC layer into an amorphous TaCN or TaSiC film. Additionally, Si and C can be used to convert MoN into an amorphous MoSiN or MoCN film. It should be noted that other amorphizing agents can also be used, such as B, Al, and Ge for example. As a result, the uppermost region of the barrier layer 32 is amorphous because of the added amorphizing agent, while the lowermost region of the barrier layer 32 layer retains the original crystalline structure (e.g., polycrystalline) of the first metal layer 22. By virtue of selectively forming a graded barrier layer 32 to include a diffusion barrier layer (e.g., TaSiC, TaCN, MoSiN, or the like) in the uppermost region, a more robust and thermally stable gate electrode is obtained. As will be appreciated, the barrier layer 32 may be formed directly on the first dielectric layer 18 without any first metal layer so that the material closest to first dielectric layer 18 is partially amorphized, provided that the barrier layer 32 sets the required work function for the device.

In accordance with various embodiments of the present invention, the barrier layer 32 is selectively formed on the first metal layer 22 with increasingly amorphous layers by alternately applying a metal ALD process and an amorphizing ALD process. First, an amorphizing ALD process selectively deposits a first thin layer 31 (e.g., TaSiC or TaCN) over the first metal layer 22 layer by applying a $TaF_5$ pulse, then purging with Argon, then pulsing with an amorphizing agent ($ND_3$ or $SiCl_4$) and then purging with Argon again. Next, a metal ALD process selectively deposits a second thin layer 33 (e.g., TaC) over the first thin layer 31 layer by applying a $TaF_5$ pulse, then purging with Argon, then pulsing with plasma (e.g., $CH_4$ or $C_2H_2$) and then purging with Argon again. The remaining thin layers 35, 37, 39, etc. are formed by proportionally applying the metal ALD process and amorphizing ALD process in a controlled way so that the amorphizing ALD process is applied more frequently as the barrier layer 32 is built up. By varying the rate of application, the metal ALD process predominates during formation of the lower region of the barrier layer 32, while the amorphizing ALD process predominates during formation of the uppermost region of the barrier layer 32. For example, the amorphizing ALD process may be repeated X number of times, and then the metal ALD process is applied, and then the amorphizing ALD process is repeated Y number of times (where Y>X) to gradually incorporate more N or Si into the metal. By forming the barrier layer 32 with an amorphous uppermost region, silicon from an overlying polysilicon layer is blocked from diffusing into the underlying metal layer 22 during subsequent processing of the semiconductor structure 10 at elevated temperatures, such as can occur, for example, during high temperature anneal, deposition, or other process steps.

Figure 4:
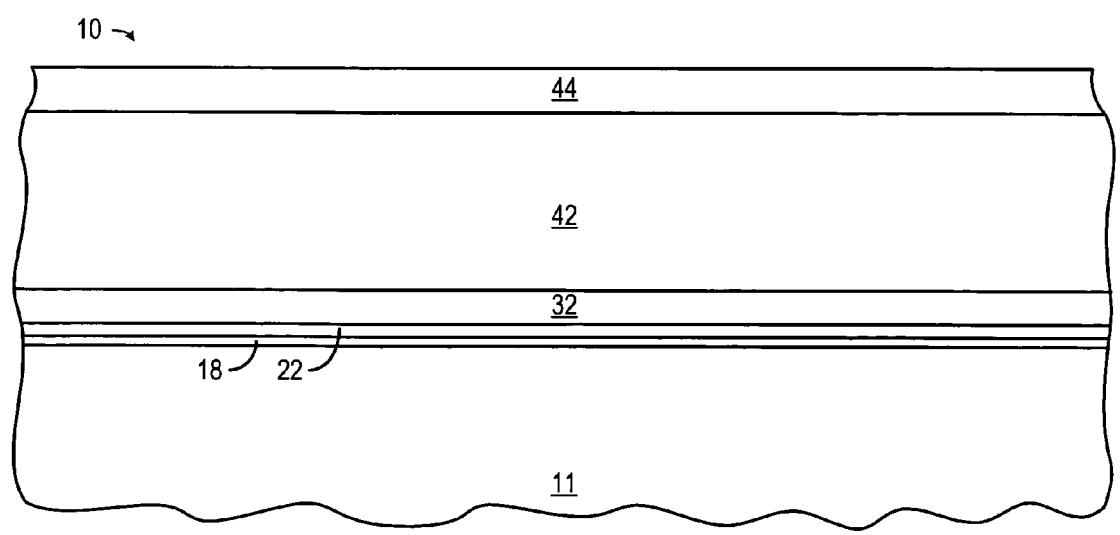
FIG. 4 illustrates processing subsequent to FIG. 3 after a polysilicon cap layer and an ARC layer are deposited over the barrier layer to form an unetched gate stack.

FIG. 4 illustrates processing subsequent to FIG. 3 after a conductive or silicon containing layer 42 and an ARC layer 44 are deposited over the barrier layer 32 to form an unetched gate stack. The silicon containing layer 42, which is either deposited as a conductive material or subsequently is made to be conductive, is deposited over the barrier layer 32. In a selected embodiment, silicon containing layer 42 is a polysilicon cap layer or a polysilicon-germanium cap layer formed using CVD, PECVD, PVD, ALD, or any combination(s) thereof to a thickness in the range of approximately 10-150 nanometers, though other materials (e.g., NMOS or PMOS metals) and thicknesses may be used. Silicon containing layer 42 may also be a doped or undoped amorphous silicon or silicon-germanium layer. An anti-reflective coating (ARC) 44 is subsequently formed over silicon containing layer 42 to a thickness in the range of approximately 1-20 nm, though other thicknesses may be used. In a selected embodiment, ARC layer 44 is formed by depositing a silicon-rich silicon nitride layer, an organic ARC, a silicon-oxy nitride, or any ARC material which serves an ARC function for the particular lithography process. As will be appreciated, ARC layer 44 may be applied directly to the conductive layer 42 or as part of a multilayer mask on the conductive layer 42.

Figure 5:
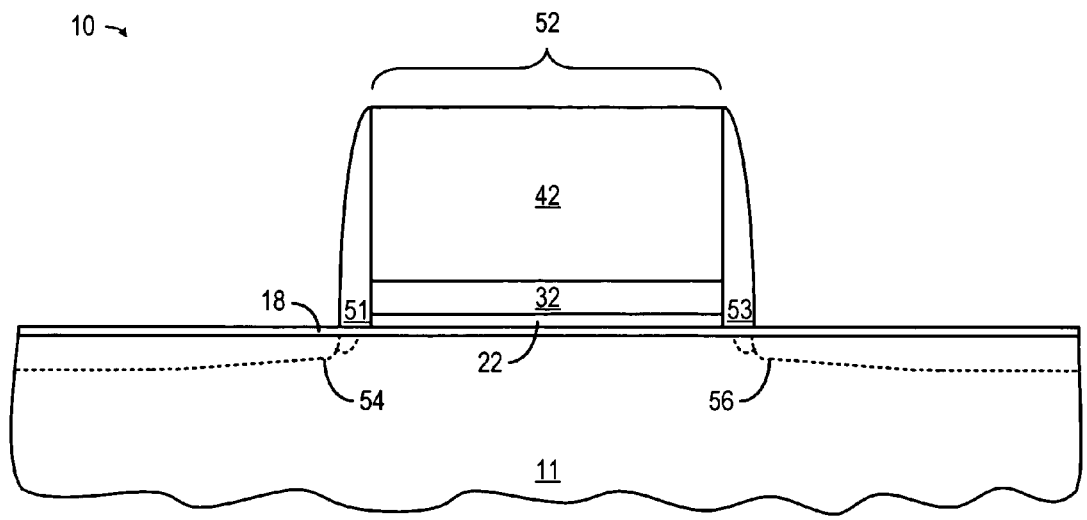
FIG. 5 illustrates processing subsequent to FIG. 4 after the unetched gate stack is patterned into gate structures, first spacers are formed adjacent the gate structures and initial or extension implant regions are formed.

Once the unetched gate stack is formed, an etched gate stack may be formed using any desired pattern and etching processes to form an etched gate stack over the semiconductor substrate 11, including application and patterning of photoresist directly on the ARC layer 44, though multi-layer masking techniques may also be used. Regardless of which etching process is used, FIG. 5 illustrates processing of the semiconductor structure 10 subsequent to FIG. 4 after the unetched gate stack is patterned into one or more gate structures 52, first spacers 51, 53 are formed adjacent the gate structure 52 and initial or extension implant regions 54, 56 are formed. As a preliminary step, a gate mask and etch process is performed to pattern the first metal layer 22, graded barrier layer 32, and silicon containing layer 42, resulting in the formation of an etched gate stack 52 over the substrate 11. The etched gate stack 52 includes a first metal layer 22 on the gate dielectric 18, a graded barrier layer 32 on layer 22, and an overlying cap formed of silicon containing layer 42. ARC layer 44 may also be initially patterned during the gate stack etch, but it can be fully removed after the gate etch, and thus is not shown in FIG. 5. Because silicon containing layer 42 serves to protect the metal gates during subsequent etches and cleans, there is no need to keep an ARC layer 44 on top of the gates. This is advantageous in that the ARC layer 44 need not later be separately etched during a contact etch process to form a contact to the gate, and instead can be wet etched. Furthermore, complete removal of the ARC layer 44 enables a more robust silicidation process on top of the gate.

Continuing with FIG. 5, after patterning the gate structure 52, first spacers 51, 53 are formed on the sides of the gate structure 52. While any desired spacer formation process may be used, the first spacers 51, 53 may be formed by depositing a thin layer of silicon nitride (e.g., 100-300 Angstroms) and then anisotropically etching the wafer so that the silicon nitride is left only along the sidewalls of the gate structures 52. As a result of the etch, the resulting spacers 51, 53 will have tapered shaped with a predetermined thickness or width near the bottom each gate (e.g., 50-200 Angstroms). As depicted, first spacers 51, 53 serve to protect the metal gates from being etched during subsequent etch processes (e.g., Piranha cleaning steps used to remove photoresist or masking layers used to separately form NMOS and PMOS devices) which can attack an exposed metal layer used in a metal gate. In another embodiment, the spacers 51, 53 may be eliminated. After formation of first spacers 51, 53, unprotected portions of gate dielectric 18 (e.g., portions other than beneath etched gate structure 52) may optionally be removed using either dry or wet chemistries, or by annealing to convert the material to a volatile species, depending on the particular dielectric material used. Next, extension regions 54, 56 are formed self-aligned to etched gate structure 52. Extension regions are formed in MOS transistor structures as extensions to the source and drain regions to prevent short channel effects. As illustrated, halo implants may also be formed in the substrate.

Figure 6:
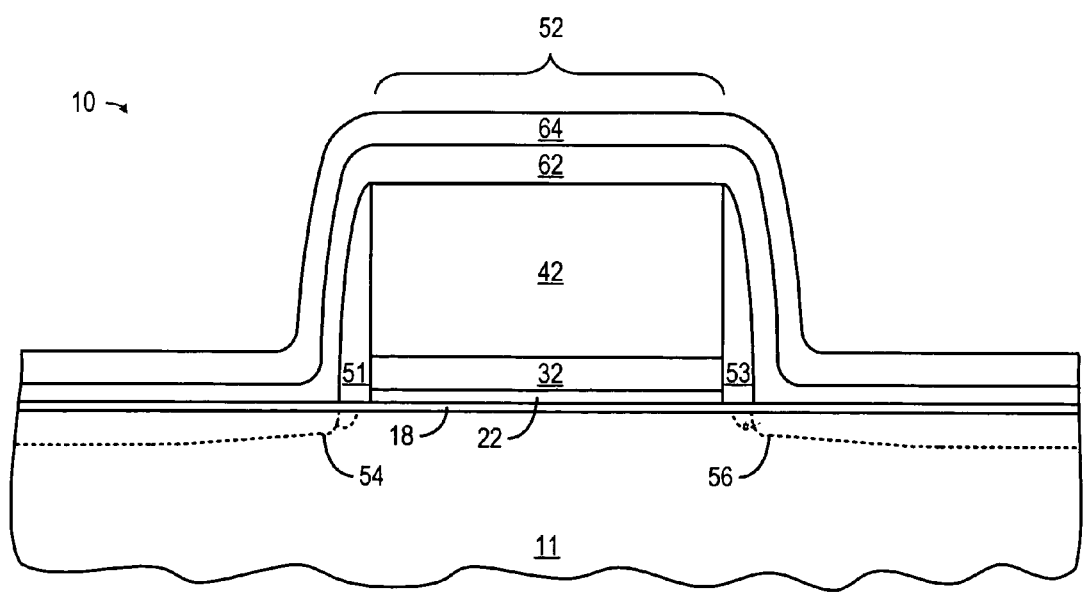
FIG. 6 illustrates processing subsequent to FIG. 5 after an oxide layer and a nitride layer are deposited over semiconductor structure.

FIG. 6 illustrates processing of the semiconductor structure 10 subsequent to FIG. 5 after an oxide layer 62 and a nitride layer 64 are deposited over semiconductor structure 10. As depicted, an oxide liner 62 is deposited over the device, including over etched gate structure 52, and first spacers 51, 53, and then a second layer 64 is formed over oxide liner 62. In one implementation, oxide liner 62 is a layer of silicon dioxide that is approximately 50-250 Angstroms thick, while layer 136 is a layer of silicon nitride that is approximately 100-1000 Angstroms thick, though other materials and thicknesses may be used so long as they allow for selective etching and do not react with any silicide forming metal used to silicide the gate, source and/or drain regions.

Figure 7:
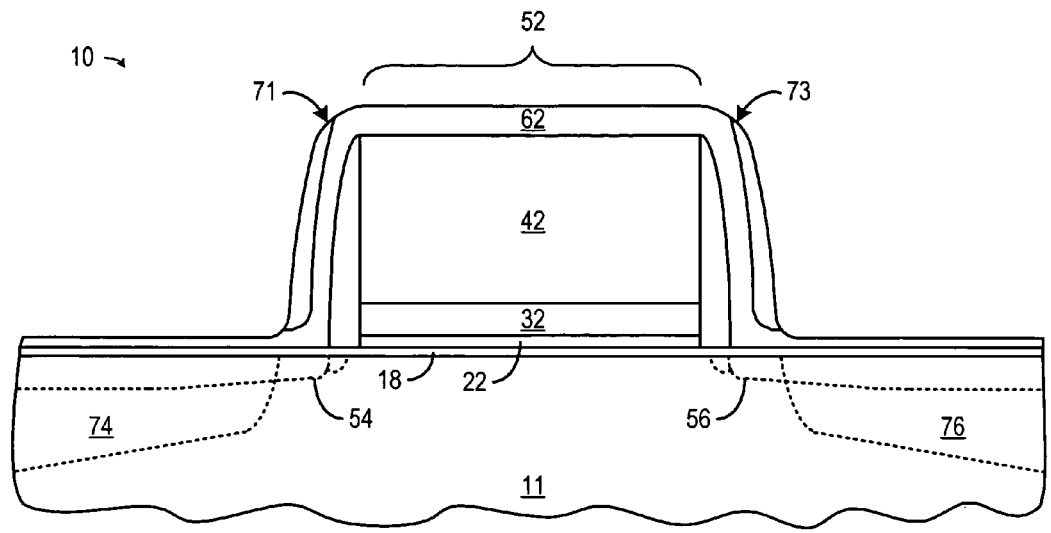
FIG. 7 illustrates processing subsequent to FIG. 6 after second spacers and source/drain regions are formed.

FIG. 7 illustrates processing of the semiconductor structure 10 subsequent to FIG. 6 after second spacers 71, 73 and source/drain regions 74, 76 are formed. As illustrated, the second sidewall spacers 71, 73 are formed from the previously deposited layers. In particular, previously deposited layers 62 and 64 are anisotropically etched to form second spacers 71, 73 without completely removing oxide liner 62. This combined etch of silicon dioxide and silicon nitride can be accomplished using a conventional dry etch chemistry of $CF_4$, HBr and Ar. The oxide liner 62 may be thinned during formation of spacers 71, 73, but this is not detrimental as long as the underlying substrate material (e.g. silicon) is not exposed at this point in the process. As also shown in FIG. 7, source/drain regions 74, 76 are formed in a self-aligned manner by implantation after formation of spacers 71, 73 through the thinned oxide liner 62. Source/drain regions 74, 76 are formed as part of the transistor which includes etched gate structure 52 using conventional implantation techniques.

Figure 8:
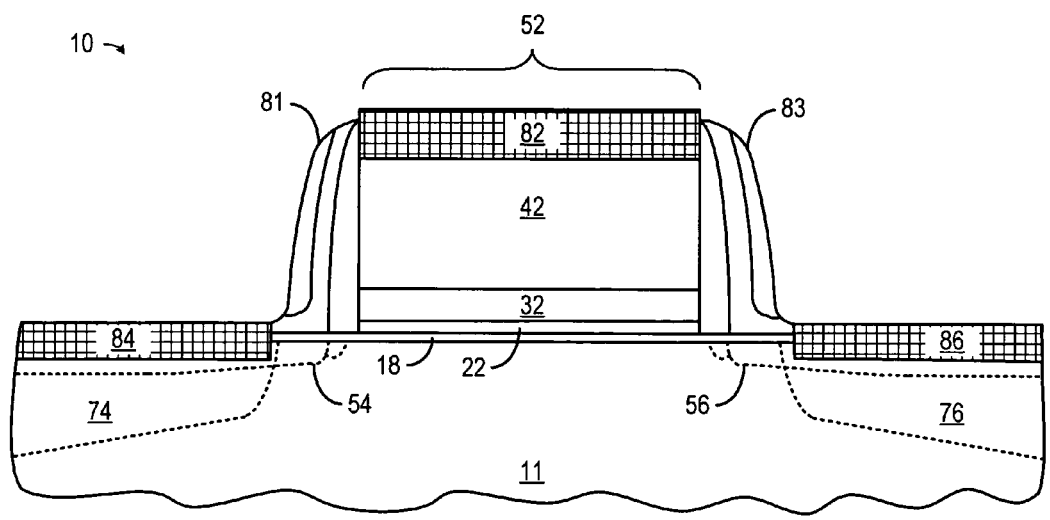
FIG. 8 illustrates processing subsequent to FIG. 7 after formation of salicide regions on the gate and source/drain regions.

FIG. 8 illustrates processing of the semiconductor structure 10 subsequent to FIG. 7 after formation of salicide regions 82, 84, 86 on the gate and source/drain regions. As a preliminary step, an anneal is performed to diffuse the extension and source/drain regions 54, 56, 74, 76 to the desired profile and to activate the dopants. Thereafter, remaining portions of the oxide liner 62 are removed from at least the top of the etched gate structure 52 and selected portions of the source/drain regions of the device where silicide is to be formed. As illustrated, the remnant sidewall spacers 81, 83 are formed from the previously deposited and etched layers. Silicide is then formed on at least the exposed source/drain regions and gates using a self-aligned process, such as by depositing a blanket layer of titanium, cobalt or nickel and thermally reacting this metal with the adjacent silicon regions to form salicide regions 82, 84, 86. Thus, there is little deleterious effect in using a silicon containing cap layer 42 as part of the etched gate structure 52 from a resistance perspective because the silicidation process used to silicide the source/drain regions can be used to silicide the gate at the same time for satisfactory resistance levels.

Figure 9:
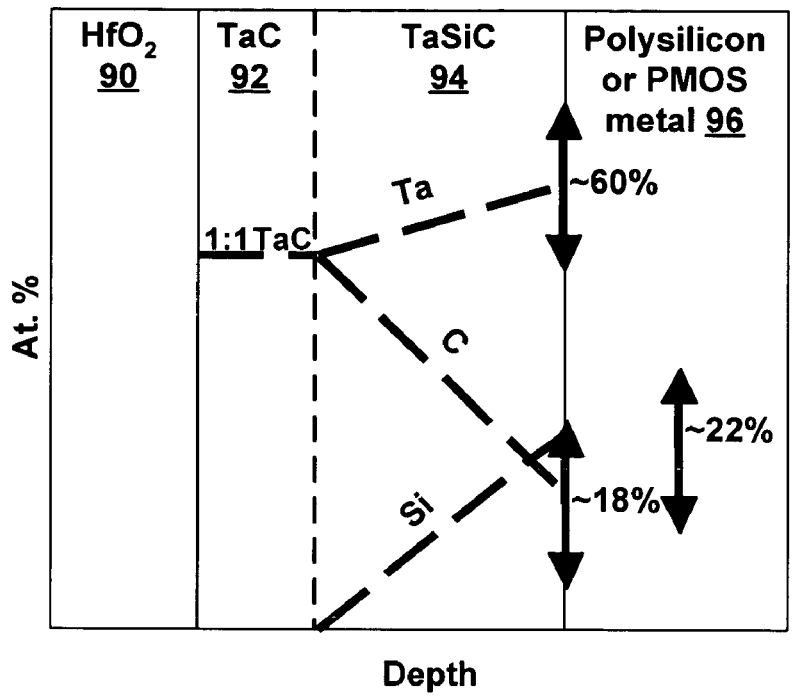
FIG. 9 graphically represents the profile concentrations of contributing materials in an exemplary graded gate electrode.

The various embodiments of the present invention described herein may be used to form a graded metal gate electrode using atomic layer deposition having improved thermal stability and lower leakage current. In fabricating a metal gate electrode that includes a metal layer and a polysilicon cap layer, a transition or barrier layer is formed there between wherein the region closest to the gate dielectric is polycrystalline and the region closest to the polysilicon cap layer is amorphous. The transition layer is graded amorphously from one composition to the next by adding an amorphizing element in increasing amounts during formation of the transition layer by atomic layer deposition techniques. The grading is illustrated in FIG. 9 which graphically represents the profile concentrations of contributing materials in an exemplary graded TaC-based gate electrode. As depicted, the gate electrode is formed over a gate dielectric layer 90 as a combination of a first metal (TaC) layer 92, a transition (TaSiC) layer 94 and a polysilicon cap or PMOS metal layer 96. The gate dielectric layer 90 may be formed from hafnium dioxide ($HfO_2$) and the first metal layer 92 is formed by tantalum and carbon in equal amounts (1:1 TaC). As for the transition TaSiC on the depth of the layer 94. As an example, FIG. 9 shows how the atomic layer deposition process is used to increase the content of silicon in the TaSiC layer 94 as it is constructed, while simultaneously the percentage contribution of tantalum and carbon also change. Upon completion of the fabrication of the TaSiC layer 94, the resulting profile at the surface where the layer 96 is formed is approximately 18 percent carbon, approximately 22 percent silicon and approximately 60 percent tantalum. With the appropriate composition of the TaSiC layer 94, an amorphous layer can be stabilized to over 1000° C.

Figure 10:
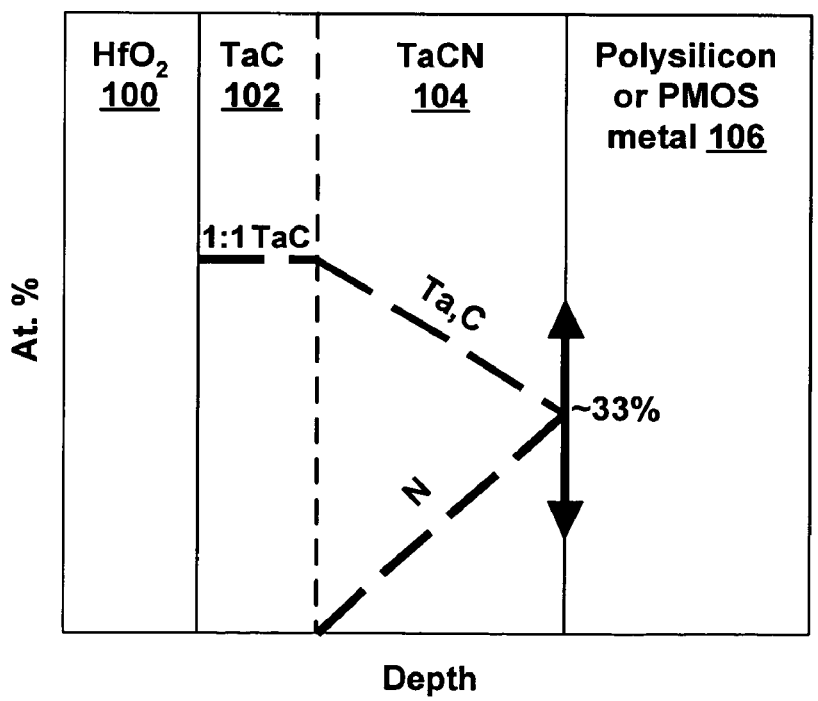
FIG. 10 graphically represents the profile concentrations of contributing materials in a second exemplary graded gate electrode.

As will be appreciated, other amorphizing materials may be used to construct graded metal gate electrodes, such as illustrated in FIG. 10 which graphically represents the profile concentrations of contributing materials in a second exemplary graded TaCN gate electrode. As depicted, the gate electrode is formed over a $HfO_2$ gate dielectric layer 100 as a combination of a first metal (TaC) layer 102, a transition (TaCN) layer 104 and a polysilicon cap or PMOS metal layer 106. Again, the first metal layer 102 is formed by tantalum and carbon in equal amounts (1:1 TaC). As for the transition TaCN layer 104, the proportional contributions of the tantalum, carbon and nitrogen change, depending on the depth of the layer 104. As an example, FIG. 10 shows how the atomic layer deposition process is used to increase the content of nitrogen in the TaCN layer 104 as it is constructed, while simultaneously the percentage contribution of tantalum and carbon also change. Upon completion of the fabrication of the TaCN layer 104, the resulting profile at the surface where the layer 106 is formed is approximately 33 percent carbon, approximately 33 percent silicon and approximately 33 percent tantalum.

In addition to using different amorphizing materials, various embodiments of the present invention may also be used with other metal materials that are not thermally stable against polysilicon. The interaction between MoN and polysilicon results in large non-homogenous polysilicon grains that manifests as a hazy polysilicon capping layer. Additionally, some poly/metal gates structures, such as those with an IrO2 metal gate, react to form an interfacial SiO2 layer between the IrO2 and the capping polysilicon layer. This SiO2 layer results in a second capacitor in series with the gate dielectric and has the effect of increasing the capacitance equivalent thickness (CET) of the device. To address this, the present invention may be employed to deposit a thin IrO2 layer (e.g., 10 Angstroms) to set the PMOS device work function, and then gradually add silicon to form a graded IrSiO transition or barrier layer that is an excellent barrier because of its amorphous crystalline structure.

Possible applications for the gate electrode engineering techniques disclosed herein include forming metal gate electrodes used in transistor devices. In such applications, it will be appreciated that additional processing steps will be used to complete the fabrication of the metal gate electrodes into functional transistor devices. As examples, one or more sacrificial oxide formation, stripping, isolation region formation, extension implant, halo implant, spacer formation, source/drain implant, silicide formation, heat drive or anneal steps, and/or polishing steps may be performed, along with conventional backend processing (not depicted), typically including formation of multiple levels of interconnect that are used to connect the transistors in a desired manner to achieve the desired functionality. In addition, other semiconductor device levels may be formed underneath or above semiconductor structure 10. Thus, the specific sequence of steps used to complete the fabrication of the transistor devices may vary, depending on the process and/or design requirements. While the illustrative embodiments are described with reference to forming an graded metal gate electrode of a MOSFET transistor device, it will be appreciated that various embodiments of the present invention can be used for any future CMOS technology that utilizes metal gates and high-k dielectrics. Other possible applications of the layer etch techniques disclosed herein include forming graded metal layers included in non-volatile memory (NVM) transistor devices (such as a nanocluster stack-based NVM devices and floating gates transistor devices), Fin Field Effect Transistors (FinFETs), Double gate Fully Depleted Semiconductor-on-Insulator (FDSOI) transistors or other transistor geometries.

In one form, there is provided herein method for fabricating a semiconductor structure by forming a gate dielectric layer over a semiconductor substrate, then forming a metal layer (e.g., a thin layer of TaC or MoN) over the gate dielectric layer, then forming a transition layer (e.g., a graded layer of TaSiC, TaCN, MoCN or MoSiN) over the first metal layer using an atomic layer deposition process in which an amorphizing material (e.g., silicon or nitrogen) is increasingly added as the transition layer is formed, and then depositing a conductive layer (e.g., polysilicon or metal) on the transition layer. By forming the transition layer as a graded layer in which the concentration of amorphizing material increases with the thickness of the transition layer, the transition layer is provided with a lower region with a polycrystalline structure and an upper region with an amorphous crystalline structure. By selectively patterning and etching the conductive layer, transition layer and first metal layer, an etched gate stack may be formed for use in forming a PMOS or NMOS transistor.

In another form, a method is provided for forming a gate electrode. After depositing a first metal layer over a gate dielectric layer, an atomic layer deposition process is used to form a transition layer over the first metal layer. In an example implementation, the atomic layer deposition process increasingly adds an amorphizing material (e.g., silicon, carbon, nitrogen, boron, aluminum or germanium) to a metal material (e.g., TaC, MoN, etc.) as the transition layer is formed. As formed, the transition layer is a graded layer (e.g., MoCN, MoSiN, TaCN, TaSiC etc.) that is relatively polycrystalline near the first metal layer and is relatively amorphous further away from the first metal layer. Next, a conductive layer is deposited on the transition layer. Finally, at least the conductive layer, transition layer and first metal layer are selectively etched to form a gate electrode.

In yet another form, a method is provided for fabricating a graded metal gate electrode by depositing a metal layer using atomic layer deposition, adding an amorphizing element in an increasing dosage during atomic layer deposition to form a graded barrier layer over the metal layer, depositing a polysilicon cap layer on the graded barrier layer, and selectively etching at least the polysilicon cap layer, graded barrier layer and metal layer to form a gate electrode. As formed, the graded barrier layer may include an amorphized laer (e.g., MoCN, MoSiN, TaCN or TaSiC) that acts as a barrier layer to block direct interaction between subsequently formed silicon (from the polysilicon cap formation) from diffusing into the gate dielectric layer. As a result, a thermally stable metal gate electrode structure is provided which provides the desired work functions and has reduced gate leakage current.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and. drains and extensions may be p-type or n-type, depending on the polarity of the underlying substrate or well region, in order to form either p-type or n-type semiconductor devices. Moreover, the thickness of the described layers may deviate from the disclosed thickness values, and any specified etch chemistries are provided for illustration purposes only. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure, comprising:
    providing a substrate;
    forming a gate dielectric layer over the substrate;
    forming a first metal-based layer over the gate dielectric layer;
    forming a transition layer over the first metal-based layer using an atomic layer deposition process in which an amorphizing material is increasingly added as the transition layer is formed; and
    depositing a conductive layer on the transition layer.

2. The method of claim 1 wherein forming a first metal-based layer comprises depositing a thin layer of TaC using an atomic layer deposition process.

3. The method of claim 1 wherein the amorphizing material is selected from a group consisting of silicon or nitrogen.

4. The method of claim 1, where the first metal-based layer is formed from MoN or TaC.

5. The method of claim 1, where forming a transition layer comprises applying a metal ALD process and an amorphizing ALD process so that the amorphizing ALD process is applied more frequently as the transition layer is formed, where the amorphizing ALD process comprises applying a TaF5 pulse, then purging with Argon, then pulsing with an amorphizing agent and then purging with Argon again; and the metal ALD process comprises applying a TaF5 pulse, then purging with Argon, then pulsing with plasma and then purging with Argon again.

6. The method of claim 1, where the transition layer comprises a graded layer of TaSiC in which the concentration of silicon increases with the thickness of the transition layer.

7. The method of claim 1, where the transition layer comprises a graded layer of TaCN in which the concentration of nitrogen increases with the thickness of the transition layer.

8. The method of claim 1, where the transition layer comprises a graded layer of MoSiN in which the concentration of silicon increases with the thickness of the transition layer.

9. The method of claim 1, where the transition layer comprises a graded layer of MoCN in which the concentration of carbon increases with the thickness of the transition layer.

10. The method of claim 1, where the conductive layer is polysilicon so that the transition layer acts to block diffusion of silicon into the gate dielectric layer.

11. The method of claim 1, where the conductive layer is a metallic layer so that the transition layer acts to block diffusion of metal into the gate dielectric layer.

12. The method of claim 1 further comprising patterning and etching the conductive layer, transition layer and first metal-based layer to form an etched gate stack for use in forming a MOS transistor.

13. The method of claim 1, where forming a transition layer comprises using an atomic layer deposition process in which an amorphizing material is increasingly added so that the transition layer has a lower region with a polycrystalline structure and has an upper region with an amorphous crystalline structure.

14. A method for forming a gate electrode, comprising:
   forming a first metal-based layer over a gate dielectric layer;
   using an atomic layer deposition process to form a transition layer over the first metal-based layer that is more polycrystalline than amorphous near the first metal-based layer and is more amorphous than polycrystalline further away from the first metal-based layer;
   depositing a conductive layer on the transition layer; and
   selectively etching at least the conductive layer, transition layer and first metal-based layer to form a gate electrode.

15. The method of claim 14, where the atomic layer deposition process increasingly adds an amorphizing material to a metal material as the transition layer is formed.

16. The method of claim 15, where the amorphizing material comprises silicon, carbon, nitrogen, boron, aluminum or germanium.

17. The method of claim 14, where the transition layer comprises a graded layer of MoCN, MoSiN, TaCN or TaSiC.

18. The method of claim 14, where the first metal-based layer comprises TaC or MoN.

19. A method for fabricating a graded metal gate electrode, comprising:
   depositing a first metal-based layer using atomic layer deposition;
   adding an amorphizing element in an increasing dosage during atomic layer deposition to form a graded barrier layer over the first metal-based layer;
   depositing a polysilicon cap layer on the graded barrier layer; and
   selectively etching at least the polysilicon cap layer, graded barrier layer and first metal-based layer to form a gate electrode.

20. The method of claim 19, where the graded barrier layer comprises MoCN, MoSiN, TaCN or TaSiC.

* * * * *